US006236619B1

(12) United States Patent
Cho et al.

(10) Patent No.: US 6,236,619 B1
(45) Date of Patent: May 22, 2001

(54) SYNCHRONOUS DYNAMIC RANDOM ACCESS MEMORY SEMICONDUCTOR DEVICE HAVING WRITE-INTERRUPT-WRITE FUNCTION

(75) Inventors: Geun-hee Cho; Chi-wook Kim, both of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/559,265

(22) Filed: Apr. 27, 2000

(30) Foreign Application Priority Data

Apr. 29, 1999  (KR) .................................................. 99-15434

(51) Int. Cl.[7] ..................................................... G11C 8/00
(52) U.S. Cl. .................... 365/233; 365/230.03; 365/203; 365/195
(58) Field of Search ............................. 365/233, 230.03, 365/203, 195

(56) References Cited

U.S. PATENT DOCUMENTS 5,594,704 * 1/1997 Konishi et al. ....................... 365/233
5,781,496 * 7/1998 Pinkham et al. ................. 365/230.03

* cited by examiner

Primary Examiner—Richard Elms
Assistant Examiner—VanThu Nguyen
(74) Attorney, Agent, or Firm—Jones Volentine, L.L.C.

(57) ABSTRACT

A synchronous dynamic random access memory (SDRAM) semiconductor device is provided. The SDRAM has a write-interrupt-write function and includes a first memory block for storing data, a first sense amplifier for sensing the data stored in the first memory block, first and second groups of input/output lines, connected to the first sense amplifier, and a write-interrupt-write signal generating portion for receiving an externally input write signal and an internal clock signal to generate a write-interrupt-write signal, and for providing the write-interrupt-write signal to the first sense amplifier. When an externally input data is written to the first memory block through the first group of input/output lines in response to the write signal enabled at a first point in time and the write signal is enabled at a second point in time to write data to the first memory block through the second group of input/output lines, the write-interrupt write signal generator enables the write-interrupt-write signal after a predetermined number of cycles of the internal clock signal from the second point in time at which the write signal is enabled, thereby immediately precharging the first group of input/output lines. As a result of this design, the write-interrupt-write function can be accurately carried out.

8 Claims, 3 Drawing Sheets

SYNCHRONOUS DYNAMIC RANDOM ACCESS MEMORY SEMICONDUCTOR DEVICE HAVING WRITE-INTERRUPT-WRITE FUNCTION

This application relies for priority upon Korean Patent Application No. 99-15434, filed on Apr. 29, 1999, the contents of which are herein incorporated by reference in their entirety.

BACKGROUND OF THE INVENTION

The present invention relates to a semiconductor memory device, and more particularly, to a double data rate (DDR) synchronous dynamic random access memory (SDRAM) having a write-interrupt-write function.

DDR SDRAM semiconductor devices each have a write-interrupt-write function. In a DDR SDRAM, data to be written is input from the outside through one group of input/output lines to a memory block. The write-interrupt-write function refers to when the writing of data is interrupted for the writing of data input through another group of input/output lines to the memory block.

In the DDR SDRAM semiconductor device, a period of two clock cycles of an external clock signal is taken to externally input data loaded onto the groups of input/output lines. However, in a conventional DDR SDRAM semiconductor, such a data loading timing is not considered in performing the write-interrupt-write function, with the result that a mis-operation may occur in the DDR SDRAM memory device.

SUMMARY OF THE INVENTION

It is an object of the present invention to provide a synchronous dynamic random access memory (SDRAM) semiconductor device capable of accurately performing a write-interrupt-write function.

In one embodiment, the present invention provides a synchronous dynamic random access memory (SDRAM) semiconductor device having a write-interrupt-write function. This SDRAM semiconductor device includes a first memory block for storing data, a first sense amplifier for sensing the data stored in the first memory block, first and second groups of input/output lines, connected to the first sense amplifier, and a write-interrupt-write signal generating portion for receiving an externally input write signal and an internal clock signal, generating a write-interrupt-write signal and providing the write-interrupt-write signal to the first sense amplifier. When externally input data is written to the first memory block through the first group of input/output lines in response to the write signal enabled at a first point in time and the write signal is enabled at a second point in time to write data to the first memory block through the second group of input/output lines, the write-interrupt write signal generator enables the write-interrupt-write signal after a predetermined number of cycles of the internal clock signal from the second point in time at which the write signal is enabled, thereby immediately precharging the first group of input/output lines.

The write-interrupt-write signal generating portion may comprise a signal delay unit for receiving the write signal and the internal clock signal, and for delaying the write signal by a predetermined number of cycles of the internal clock signal in response to the internal clock signal and a pulse signal generator connected to the signal delay unit for generating the write-interrupt-write signal as pulses in response to the internal clock signal and the output from the signal delay unit.

The signal delay unit may further comprise first through fourth transmission gates for receiving the write signal and the internal clock signal, the first through fourth transmission gates being sequentially turned on by the internal clock signal in response to a rising or falling transition of the internal clock signal, and first through fourth latch circuits connected to the first through fourth transmission gates, respectively, for latching the outputs from the first through fourth transmission gates.

The pulse generator may further comprise a first logic circuit for combining the write signal and the internal clock signal, and for outputting the combination of the write signal and internal clock signal, an inverter chain including an odd number of inverters, for receiving the output from the first logic circuit, and a second logic circuit for generating the write-interrupt-write signal by combining the output from the first logic circuit and the output from the inverter chain.

The pulse signal generator preferably generates a write-interrupt-read signal, and the signal delay unit preferably disables the write-interrupt-write signal based on the write-interrupt-read signal. The write-interrupt-write signal is enabled in a write-interrupt-write mode or in a write-interrupt-read mode.

The synchronous dynamic random access memory semiconductor device may further comprise a second memory block for storing data, a second sense amplifier for sensing the data stored in the second memory block, and third and fourth groups of input/output lines, connected to the second sense amplifier. The first and third groups of input/output lines are preferably simultaneously activated or precharged, and the second and fourth groups of input/output lines are preferably simultaneously activated or precharged.

The synchronous dynamic random access memory semiconductor device is preferably a double data rate synchronous dynamic random access memory semiconductor device.

The synchronous dynamic random access memory semiconductor device may further comprise a clock signal converter for converting an external clock into the internal clock.

Therefore, the SDRAM semiconductor device can accurately perform the write-interrupt-write function.

BRIEF DESCRIPTION OF THE DRAWINGS

The above objects and advantages of the present invention will become more apparent by describing in detail preferred embodiments thereof with reference to the attached drawing in which.

DESCRIPTION OF THE PREFERRED EMBODIMENTS

Figure 1:
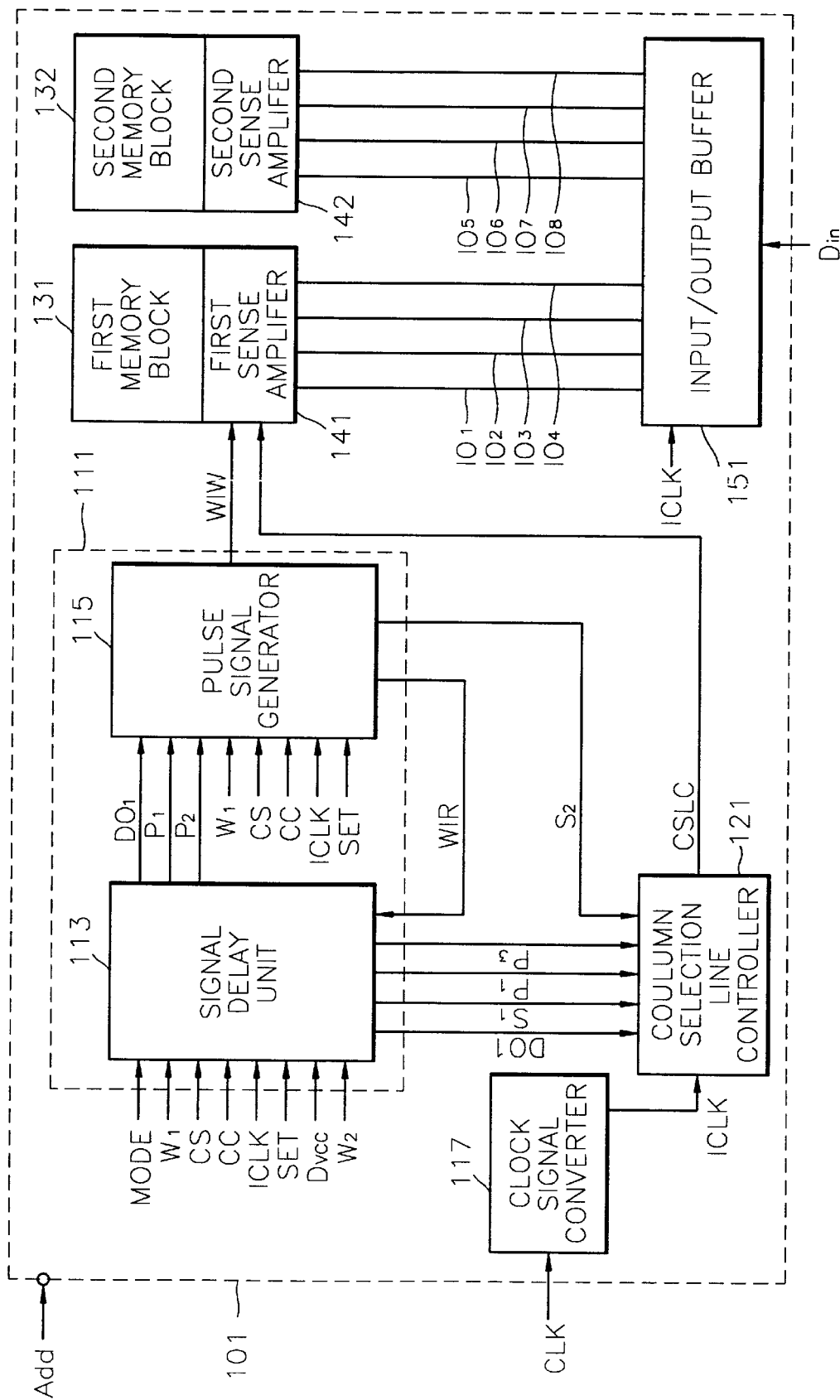
FIG. 1 is a schematic block diagram of a 128 megabyte double data rate synchronous dynamic random access memory (DDR SDRAM) semiconductor device according to a preferred embodiment of the present invention.

The present invention now will be described more fully with reference to the accompanying drawings, in which a preferred embodiment of the invention is shown. This invention may, however, be embodied in many different forms and should not be construed as being limited to the embodiment set forth below. Rather, this embodiment is provided so that this disclosure will be thorough and complete, and will fully convey the scope of the invention to those skilled in the art. The same reference numerals used in different drawings represent the same element. Furthermore, the embodiment described and illustrated below includes its complementary conductive type embodiment, i.e., the inverse signal embodiment, as well as the conductivity embodiment shown.

Referring to FIG. 1, a 128-megabyte double data rate (DDR) synchronous dynamic random access memory (SDRAM) semiconductor device 101 is provided, according to a preferred embodiment of the present invention. The DDR SDRAM device 101 includes a write-interrupt-write signal generating portion 111, a clock signal converter 117, a column selection line controller 121, first and second memory blocks 131 and 132, first and second sense amplifiers 141 and 142, first through eighth input/output lines $IO_1$ through $IO_8$, and an input/output buffer 151.

The first and second input/output lines $IO_1$, and $IO_2$ are referred to as a first input/output line group; the third and fourth input/output lines $IO_3$ and $IO_4$ are referred to as a second input/output line group; the fifth and sixth input/output lines $IO_5$ and $IO_6$ are referred to as a third input/output line group; and the seventh and eighth input/output lines $IO_7$ and $IO_8$ are referred to as a fourth input/output line group.

An address signal ADD and an external clock signal CLK are externally input to the DDR SDRAM semiconductor device 101. The external clock signal CLK is converted by the clock signal converter 117 into an appropriate internal clock signal ICLK for the DDR SDRAM device 101. The address signal ADD selects some of a plurality of memory cells (not shown) included in the first and second memory blocks 131 and 132. The address signal ADD selects these memory cells via a row decoder and a column decoder (not shown).

Externally input data $D_{in}$ is written to the memory cells selected by the address signal ADD via the input/output buffer 151, the first through eighth input/output lines $IO_1$ through $IO_8$, and the first and second sense amplifiers 141 and 142. Preferably, the input data $D_{in}$ operates in synchronization with the internal clock signal ICLK.

The write-interrupt-write signal generator 111 preferably includes a signal delay unit 113 and a pulse signal generator 115. The signal delay unit 113 receives a mode signal MODE, first and second write signals $W_1$ and $W_2$, a chip selection signal CS, a column control signal CC, the internal clock signal ICLK, a DDR set signal SET, and a supply voltage detection signal $D_{VCC}$ and outputs the signals $DO_1$, $P_1$, $P_2$, $P_3$ and $S_1$.

In order to perform the write-interrupt-write function, the write-interrupt-write signal generator 111 generates the signal $DO_1$, as soon as two cycles of the internal clock signal ICLK pass from when the first and second write signals $W_1$, and $W_2$ are enabled.

The mode signal MODE sets an output mode for the DDR SDRAM semiconductor device 101. For instance, when the mode signal MODE is logic high, the DDR SDRAM semiconductor device 101 simultaneously outputs four bits of data. When the mode signal MODE is logic low, the DDR SDRAM semiconductor device 101 simultaneously outputs more than eight bits of data, for example, 16, 32 or 64 bits of data. Although the preferred embodiment uses four data bits as the demarcation of the mode, any other suitable number could be chosen.

The DDR set signal SET sets a data rate mode for the DDR SDRAM semiconductor device 101. When the DDR set signal SET is logic low, the DDR SDRAM semiconductor device 101 operates in a single data rate mode. The first write signal $W_1$, which has the same function as that of the second write signal $W_2$, is generated faster than the second write signal $W_2$. The exact difference in speed will depend upon the specific design of the device.

The pulse signal generator 115 receives the first write signal $W_1$, the chip selection signal CS, the column control signal CC, the internal clock signal ICLK, the DDR set signal SET and the signals $DO_1$, $P_1$, and $P_2$, and generates a write-interrupt-write signal WIW, a write-interrupt-read signal WIR, which are both pulse signals, and the signal $S_2$. The signal delay unit 113 and the pulse signal generator 115 will be described in greater detail below with reference to FIG. 2.

The column selection line controller 121 receives the internal clock signal ICLK from the clock signal converter 117, and the signals $P_1$, $P_3$, $DO_1$, $S_1$, and $S_2$ from the write-interrupt-write signal generator 111, and generates a column selection line control signal CSLC. When the write-interrupt-write signal WIW is generated, the column selection line control signal CSLC deactivates a column selection line signal to be applied to a precharged group of input/output line. The column selection line controller 121 generates the column selection line control signal CSLC that is useful for more accurately performing the write-interrupt-write function.

Figure 2:
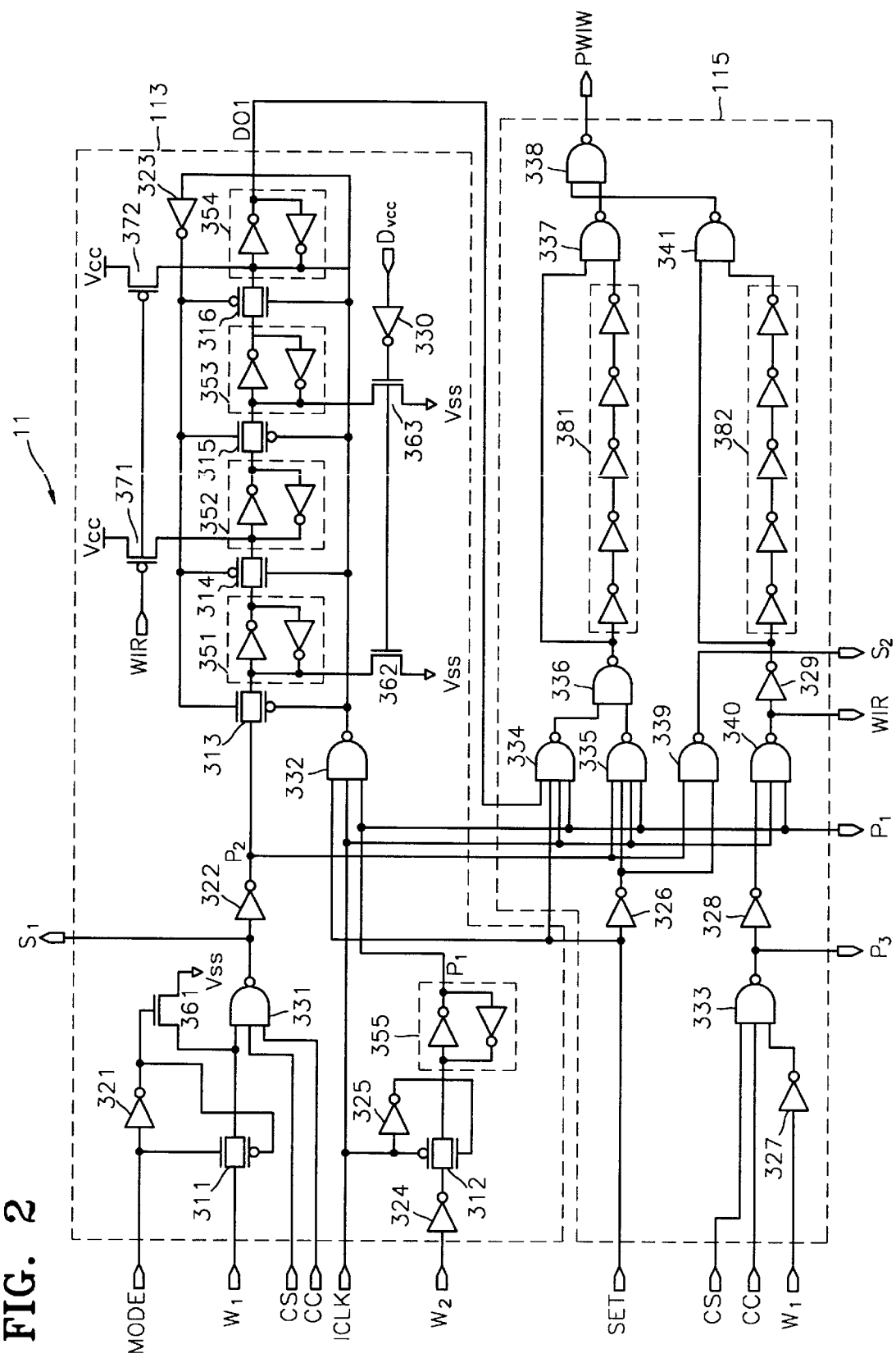
FIG. 2 is a detailed circuit diagram of the write-interrupt-write signal generator shown in FIG. 1.

FIG. 2 is a detailed circuit diagram of the signal delay unit 113 and the pulse signal generator 115 that are included in the write-interrupt-write signal generator 111 of FIG. 1. The signal delay unit 113 includes transmission gates 311 through 316, inverters 321 through 325, and 330, NAND gates 331 and 332, latch circuits 351 through 355, NMOS transistors 361, 362 and 363, and PMOS transistors 371 and 372.

The transmission gate 311 and the NMOS transistor 361 are turned on by the mode signal MODE. When the mode signal MODE is logic high, i.e, when the DDR SDRAM semiconductor device 101 outputs four bits of data, the transmission gate 311 is turned on to pass the first write signal $W_1$, and the NMOS transistor 361 is turned off.

Conversely, when the mode signal MODE is logic low, i.e., when the number of data bits from the DDR SDRAM semiconductor device 101 is not equal to 4, the transmission gate 311 is turned off to interrupt the first write signal $W_1$. Simultaneously, the NMOS transistor 361 is turned on, so that the output of the NAND gate 331 remains logic high regardless of its input signal. The NAND gate 331 receives the first write signal $W_1$, from the transmission gate 311, the chip selection signal CS and the column control signal CC, and performs a NAND operation on these input signals to generate the signal $S_1$. The inverter 322 then inverts the signal $S_1$, and outputs the signal $P_2$.

The second write signal $W_2$ is inverted by the inverter 324 and the inverted second write signal is input to the transmission gate 312. The transmission gate 312 is turned on by the internal clock signal ICLK. For instance, when the internal clock signal ICLK is logic low, the transmission gate 312 is turned on to pass the inverted second write signal. The latch circuit 355 inverts and latches the inverted second write signal from the transmission gate 312 to generate the signal $P_1$.

The NAND gate 332 receives the DDR set signal SET, the internal clock signal ICLK and the signal $P_1$, and performs an NAND operation on these input signals. When the DDR SDRAM semiconductor device 101 operates in a DDR mode, the DDR set signal SET becomes logic high. When the DDR SDRAM semiconductor device 101 operates in a write mode, the first and second write signals $W_1$ and $W_2$ become logic high.

When the DDR SDRAM semiconductor device 101 is in the DDR mode or write mode as above, the output from the NAND gate 332 is responsive to the internal clock signal ICLK. In other words, when the internal clock signal ICLK is logic high, the output from the NAND gate 332 becomes logic low. When the internal clock signal ICLK is logic low, the output from the NAND gate 332 becomes logic high.

The transmission gate 313, which receives the signal $P_2$, is controlled by the output from the NAND gate 332, and outputs the signal $P_2$. The output signal $P_2$ is latched by the latch circuit 351. When the output from the NAND gate 332 is transited from logic low to logic high, the transmission gate 313 is turned off and the transmission gate 314 is turned on, so that the output from the latch circuit 351 is latched by the latch circuit 352.

When the output of the NAND gate 332 is transited from logic high to logic low, the transmission gate 314 is turned off and the transmission gate 315 is turned on, so that the output from the latch circuit 352 is latched by the latch circuit 353. When the output from the NAND gate 332 is transited from logic low to logic high, the transmission gate 315 is turned off and the transmission gate 316 is turned on, so that the output from the latch circuit 353 is latched by the latch circuit 354. In other words, the signal $P_2$ input to the transmission gate 313 is delayed for a duration of two cycles of the internal clock signal ICLK before being output through the latch circuit 354 as the signal $DO_1$.

The NMOS transistors 362 and 363 are turned on by the supply voltage detection signal $D_{VCC}$. The supply voltage detection signal $D_{VCC}$ is inverted by the inverter 330 and the inverted supply voltage detection signal is applied to the NMOS transistors 362 and 363. The DDR SDRAM semiconductor device 101 detects an externally input supply voltage $V_{CC}$, and asserts logic low to the supply voltage detection signal $D_{VCC}$ when the supply voltage $V_{CC}$ is lower than a predetermined voltage level. Conversely, when the supply voltage $V_{CC}$ is higher than the predetermined voltage level, the DDR SDRAM semiconductor device 101 asserts the supply voltage detection signal $D_{VCC}$ to logic high.

When the supply voltage detection signal $D_{VCC}$ is logic low, the NMOS transistors 362 and 363 are turned on, so that the input signals to the latch circuits 351 and 353 become logic low, thereby ultimately asserting the signal $DO_1$, to logic low. However, when the supply voltage detection signal $D_{VCC}$ is logic high, the NMOS transistors 362 and 363 are turned off, so that the outputs from the transmission gates 313 and 315 are input to the latch circuits 351 and 353 without transition.

The PMOS transistors 371 and 372 are turned on by a write-interrupt-read signal WIR from the pulse signal generator 115. When the write-interrupt-read signal WIR is logic low, the PMOS transistors 371 and 372 are turned on, so that the input signals to the latch circuits 352 and 354 become logic high, thereby asserting the signal $DO_1$, to logic low. Meanwhile, when the write-interrupt-read signal WIR is logic high, the PMOS transistors 371 and 372 are turned off, so that the outputs from the transmission gates 314 and 316 are input to the latch circuits 352 and 354 without transition. As noted above, the first write signal $W_1$ is delayed by 2 cycles of the internal clock signal ICLK by the signal delay unit 113.

The pulse signal generator 115 includes NAND gates 333 through 341, inverters 326, 327, 328 and 329, and inverter chains 381 and 382. The inverter 326 inverts the DDR set signal SET. The NAND gate 334 receives the DDR set signal SET, the internal clock signal ICLK, the signal $P_1$, and the signal $DO_1$, and performs a NAND operation on the input signals. The NAND gate 335 receives the signals $P_1$, and $P_2$, the output signal from the inverter 326, and the internal clock signal ICLK, and performs a NAND operation on the input signals. The NAND gate 336 performs a NAND operation on the output signals from the NAND gates 334 and 335. The inverter chain 381 delays the output signal from the NAND gate 336 by a predetermined time and inverts the output signal from the NAND gate 336. The NAND gate 337 performs a NAND operation on the output signal from the NAND gate 336 and the output from the inverter chain 381.

The NAND gate 337 and the inverter chain 381 have a pulse generating function. In particular, the NAND gate 337 and the inverter chain 381 generate pulses only when the output signal from the NAND gate 336 is transited from logic low to logic high. When the output signal from the NAND gate 336 is logic low, the output signal from the inverter chain 381 is logic high and the NAND gate 337 outputs a logic high signal. Upon the transition of the output signal from the NAND gate 336, from logic low to logic high, all the input signals to the NAND gate 337 become logic high, so that the output signal from the NAND gate 337 becomes logic low. However, after a while, the output signal from the inverter chain 381 is transited from logic high to logic low, so that the output signal from the NAND gate 337 is retransited to logic high. Accordingly, the NAND gate 337 generates low pulses.

The NAND gate 339 receives the output signal from the inverter 326 and the signal $P_2$, and performs a NAND operation on the received signals, to generate a signal $S_2$. The inverter 327 inverts the first write signal $W_1$. The NAND gate 333 receives the chip select signal CS, the column control signal CC and the output signal from the inverter 327, and performs a NAND operation on the received signals. The inverter 328 inverts the output signal from the NAND gate 333. The NAND gate 340 receives the output signal from the inverter 328, the internal clock signal ICLK and the signal $P_1$, and performs a NAND operation on the received signals to generate the write-interrupt-read signal WIR.

The inverter 329 inverts the write-interrupt-read signal WIR. The inverter chain 382 delays the output signal from the inverter 329 by a predetermined time, and inverts the output signal from the inverter 329. The NAND gate 341 performs a NAND operation on the output signal from the inverter 329 and the output signal from the inverter chain 382. When the output signal from the inverter 329 is transited from logic low to logic high, the NAND gate 341 generates low pulses. The inverter chain 382 and the NAND gate 341 generate the low pulses in the same manner as in the inverter chain 381 and the NAND gate 337. The NAND gate 338 receives the output signals from the NAND gates 337 and 341, and performs a NAND operation on the received signals, to generate the write-interrupt-write signal WIW. As noted above, the write-interrupt-write signal WIW is output as high pulses from the pulse generator 115.

Figure 3:
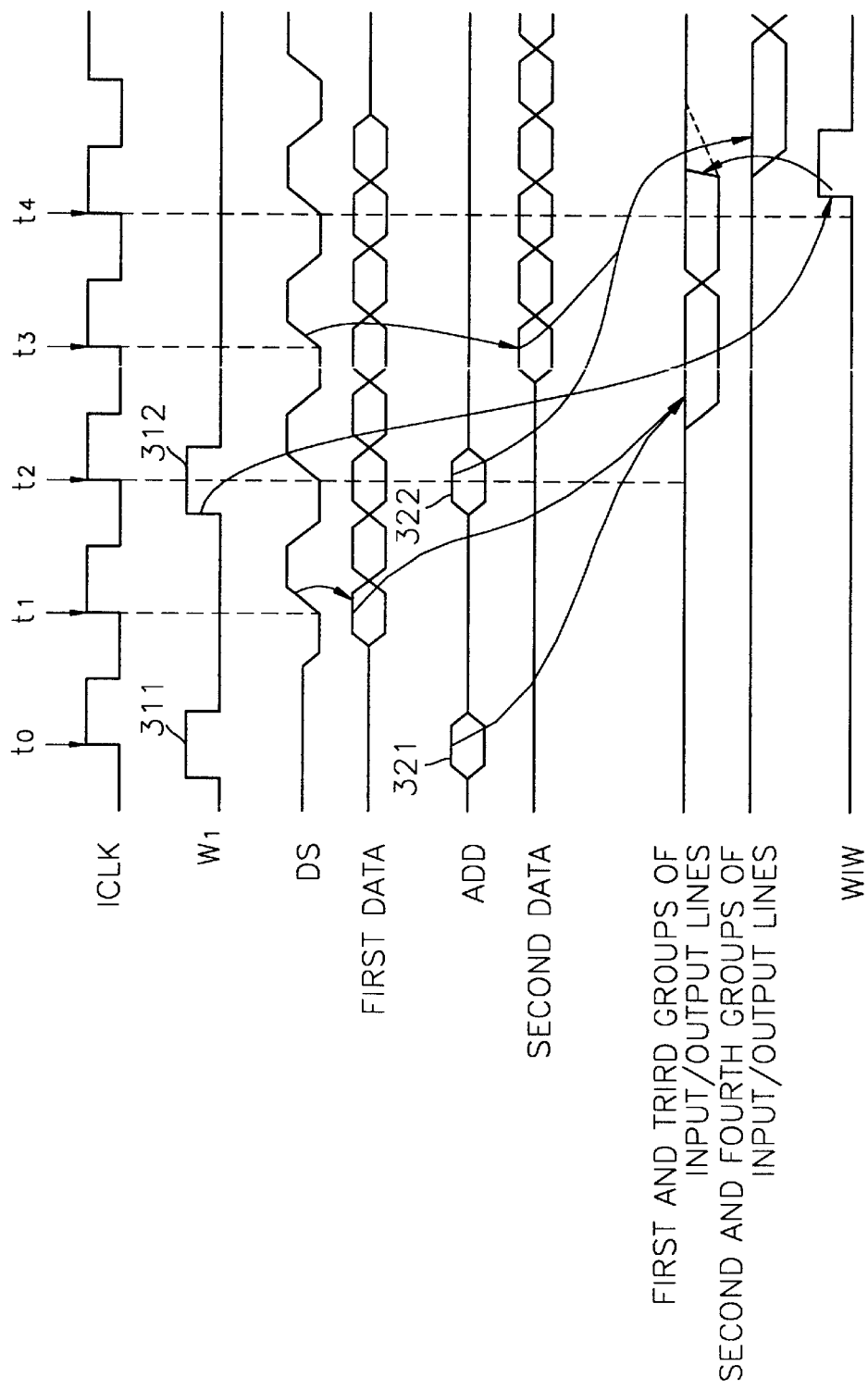
FIG. 3 is a timing diagram of signals shown in FIGS. 1 and 2.

FIG. 3 is a timing diagram of the signals shown in FIGS. 1 and 2, illustrating the operation of the DDR SDRAM semiconductor device 101 shown in FIG. 1, in which a burst length of 8 is selected for the preferred embodiment. In order to write external data to the first and second memory blocks 131 and 132, the most significant address bit $CA_{11}$ (assuming a twelve bit address) of the column address signal ADD 421 (of FIG. 3) is enabled to activate the first and third groups of input/output lines. In this state, when the first write signal $W_1$ is first enabled (411 of FIG. 3), a data strobe signal DS is enabled to a logic high state from the end of a cycle of the internal clock signal ICLK.

The reason why the data strobe signal DS is enabled at a point $t_1$ (see FIG. 3) of the internal clock signal ICLK is that the write latency of the DDR SDRAM semiconductor device 101 is set to 1. When the data strobe signal DS is enabled, first data $D_{in}$ is input to the DDR SDRAM semiconductor device 101 from the outside. The first data $D_{in}$ is loaded to the first and third groups of input/output lines, which are activated at a point $t_2$ (see FIG. 3), after the end of 2 cycles of the internal clock signal ICLK from when the first write signal $W_1$ is enabled. Such delaying in the loading of the first data $D_{in}$ to the first and third groups of input/output lines is determined because the DDR SDRAM semiconductor device 101 adopts a 2-bit prefetch technique.

In the case where the write-interrupt-write function is intended, while the external data $D_{in}$ is written to the first and second memory blocks 131 and 132 through the first and third groups of input/output lines, the most significant address bit $CA_{11}$ of the address signal ADD 422 (see FIG. 3) is disabled to select the second and fourth groups of input/output lines. In this state, the first write signal $W_1$ is again enabled. Then, the write-interrupt-write signal generator 111 receives the first write signal $W_1$, enabled at a second point in time, and enables the write-interrupt-write signal WIW after a point $t_4$ (see FIG. 3) at which 2 cycles of the internal clock signal ICLK have been terminated.

When the write-interrupt-write signal WIW is enabled, the first and second sense amplifiers 141 and 142 precharge the first and third groups of input/output lines, such that the writing of the first data $D_{in}$ to the first and second memory blocks 131 and 132 through the first and third input/output lines is interrupted. Then, second data $D_{in}$, which is input from the outside, is written to the first and second memory blocks 131 and 132 through the second and fourth groups of input/output lines.

As noted above, the write-interrupt-write signal WIW is generated after the point $t_4$ (see FIG. 3) after the completion of 2 cycles of the internal clock signal ICLK from the input of the first write signal $W_1$. for the write-interrupt-write function, thereby precharging the first and third groups of input/output lines. Accordingly, the first data is no longer written to the first and second memory blocks 131 and 132 during the write-interrupt-write function.

The present invention has been described with reference to the 128 megabyte DDR SDRAM semiconductor device 101 with a burst length of 8. However, the write-interrupt-write function according to the present invention can be applied to any DDR SDRAM semiconductor device with various memory sizes or burst lengths.

As described above, in the case where for the write-interrupt-write function, the first write signal $W_1$. is enabled at a second point in time while the external data $D_{in}$ is written to the first and second memory blocks 131 and 132 when the first and third groups of input/output lines are activated, the write-interrupt-write signal WIW is enabled after 2 cycles of the internal clock signal ICLK from the enabling of the first write signal $W_1$, thereby discharging the first and third groups of input/output lines. As a result, the writing of the external data $D_{in}$ to the first and second memory blocks 131 and 132 through the first and third input/output lines is interrupted. Therefore, the DDR SDRAM semiconductor device 101 can carry out the write-interrupt-write function accurately.

While this invention has been particularly shown and described with reference to a preferred embodiments, it will be understood by those skilled in the art that various changes in form and details may be made therein without departing from the spirit and scope of the invention as defined by the appended claims.

What is claimed is:

1. A synchronous dynamic random access memory semiconductor device having a write-interrupt-write function, comprising:
   a first memory block for storing data;
   a first sense amplifier for sensing the data stored in the first memory block;
   first and second groups of input/output lines, connected to the first sense amplifier; and
   a write-interrupt-write signal generating portion for receiving an externally input write signal and an internal clock signal, generating a write-interrupt-write signal and providing the write-interrupt-write signal to the first sense amplifier,
   wherein when externally input data is written to the first memory block through the first group of input/output lines in response to the write signal enabled at a first point in time and the write signal is enabled at a second point in time to write data to the first memory block through the second group of input/output lines, the write-interrupt write signal generator enables the write-interrupt-write signal after a predetermined number of cycles of the internal clock signal from the second point in time at which the write signal is enabled, thereby immediately precharging the first group of input/output lines.

2. The synchronous dynamic random access memory semiconductor device, as recited in claim 1, wherein the write-interrupt-write signal generating portion comprises:
   a signal delay unit for receiving the write signal and the internal clock signal, and for delaying the write signal by a predetermined number of cycles of the internal clock signal in response to the internal clock signal; and
   a pulse signal generator connected to the signal delay unit for generating the write-interrupt-write signal as pulses in response to the internal clock signal and the output from the signal delay unit.

3. The synchronous dynamic random access memory semiconductor device, as recited in claim 2, wherein the signal delay unit comprises:
   first through fourth transmission gates for receiving the write signal and the internal clock signal, the first through fourth transmission gates being sequentially turned on by the internal clock signal in response to a rising or falling transition of the internal clock signal; and
   first through fourth latch circuits connected to the first through fourth transmission gates, respectively, for latching the outputs from the first through fourth transmission gates.

4. The synchronous dynamic random access memory semiconductor device, as recited in claim 2, wherein the pulse generator comprises:
   a first logic circuit for combining the write signal and the internal clock signal, and for outputting the combination of the write signal and internal clock signal;
   an inverter chain including an odd number of inverters, for receiving the output from the first logic circuit; and
   a second logic circuit for generating the write-interrupt-write signal by combining the output from the first logic circuit and the output from the inverter chain.

5. The synchronous dynamic random access memory semiconductor device, as recited in claim 2, wherein the pulse signal generator generates a write-interrupt-read signal, and wherein the signal delay unit disables the write-interrupt-write signal based on the write-interrupt-read signal.

6. The synchronous dynamic random access memory semiconductor device, as recited in claim 1, comprising:

a second memory block for storing data;

a second sense amplifier for sensing the data stored in the second memory block; and third and fourth groups of input/output lines, connected to the second sense amplifier, wherein the first and third groups of input/output lines are simultaneously activated or precharged, and the second and fourth groups of input/output lines are simultaneously activated or precharged.

7. The synchronous dynamic random access memory semiconductor device, as recited in claim 1, wherein the synchronous dynamic random access memory semiconductor device is a double data rate synchronous dynamic random access memory semiconductor device.

8. The synchronous dynamic random access memory semiconductor device, as recited in claim 1, further comprising a clock signal converter for converting an external clock into the internal clock.

* * * * *